(12) United States Patent
Chow et al.

(10) Patent No.: US 9,620,557 B2
(45) Date of Patent: Apr. 11, 2017

(54) SEMICONDUCTOR DEVICE AND METHOD OF FORMING EWLB SEMICONDUCTOR PACKAGE WITH VERTICAL INTERCONNECT STRUCTURE AND CAVITY REGION

(71) Applicant: STATS ChipPAC, Ltd., Singapore (SG)

(72) Inventors: Seng Guan Chow, Singapore (SG); Lee Sun Lim, Singapore (SG); Rui Huang, Singapore (SG); Xu Sheng Bao, Singapore (SG); Ma Phoo Pwint Hlaing, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/974,002

(22) Filed: Dec. 18, 2015

(65) Prior Publication Data

US 2016/0104731 A1    Apr. 14, 2016

Related U.S. Application Data

(62) Division of application No. 13/149,628, filed on May 31, 2011, now Pat. No. 9,252,172.

(51) Int. Cl.
*H01L 21/768* (2006.01)
*H01L 27/146* (2006.01)
(Continued)

(52) U.S. Cl.
CPC ........ *H01L 27/1469* (2013.01); *B81C 1/0023* (2013.01); *H01L 21/76898* (2013.01);
(Continued)

(58) Field of Classification Search
CPC ................ H01L 27/146; H01L 21/768; H01L 21/76898; H01L 21/00; H01L 2924/14; H01L 2924/01078; H01L 2924/01079
(Continued)

(56) References Cited

U.S. PATENT DOCUMENTS 7,160,478 B2    1/2007    Leib et al.
7,790,505 B2    9/2010    Lin et al.
(Continued)

FOREIGN PATENT DOCUMENTS

CN    101371367 A    2/2009

*Primary Examiner* — Chuong A Luu
(74) *Attorney, Agent, or Firm* — Robert D. Atkins; Patent Law Group: Atkins and Associates, P.C.

(57) ABSTRACT

A semiconductor device has a substrate containing a transparent or translucent material. A spacer is mounted to the substrate. A first semiconductor die has an active region and first conductive vias electrically connected to the active region. The active region can include a sensor responsive to light received through the substrate. The first die is mounted to the spacer with the active region positioned over an opening in the spacer and oriented toward the substrate. An encapsulant is deposited over the first die and substrate. An interconnect structure is formed over the encapsulant and first die. The interconnect structure is electrically connected through the first conductive vias to the active region. A second semiconductor die having second conductive vias can be mounted to the first die with the first conductive vias electrically connected to the second conductive vias.

20 Claims, 9 Drawing Sheets

(51) Int. Cl.
  *B81C 1/00* (2006.01)
  *H01L 25/16* (2006.01)
  *H01L 31/0203* (2014.01)

(52) U.S. Cl.
  CPC .......... *H01L 25/165* (2013.01); *H01L 25/167* (2013.01); *H01L 27/14618* (2013.01); *H01L 27/14634* (2013.01); *H01L 27/14636* (2013.01); *H01L 31/0203* (2013.01); *H01L 2224/73265* (2013.01); *H01L 2924/01322* (2013.01); *H01L 2924/13091* (2013.01); *H01L 2924/1461* (2013.01)

(58) Field of Classification Search
  USPC .......... 438/64, 106, 107, 112, 124, 126, 127
  See application file for complete search history.

(56) References Cited

U.S. PATENT DOCUMENTS

| | | | |
|---|---|---|---|
| 7,919,410 | B2 | 4/2011 | England et al. |
| 8,211,751 | B2 | 7/2012 | Yamamoto et al. |
| 2002/0096753 | A1 | 7/2002 | Tu et al. |
| 2005/0001331 | A1 | 1/2005 | Kojima et al. |
| 2005/0253226 | A1* | 11/2005 | Tian .................... H01L 23/3121 257/667 |
| 2005/0285154 | A1 | 12/2005 | Akram et al. |
| 2006/0065964 | A1 | 3/2006 | Ohsumi |
| 2006/0087042 | A1 | 4/2006 | Kameyama et al. |
| 2006/0102974 | A1 | 5/2006 | Chen |
| 2008/0083975 | A1 | 4/2008 | Chao et al. |
| 2008/0179758 | A1 | 7/2008 | Wong et al. |
| 2008/0308928 | A1 | 12/2008 | Chang et al. |
| 2009/0065923 | A1 | 3/2009 | Chung |
| 2009/0090412 | A1 | 4/2009 | Calwer et al. |
| 2010/0065948 | A1 | 3/2010 | Bae et al. |
| 2010/0072618 | A1 | 3/2010 | Camacho et al. |
| 2010/0140780 | A1* | 6/2010 | Huang .................. H01L 21/561 257/690 |
| 2010/0171205 | A1 | 7/2010 | Chen et al. |
| 2010/0224974 | A1 | 9/2010 | Shim et al. |
| 2010/0237496 | A1 | 9/2010 | Touzelbaev et al. |
| 2010/0244221 | A1 | 9/2010 | Ko et al. |
| 2010/0320601 | A1 | 12/2010 | Pagaila et al. |
| 2011/0049662 | A1 | 3/2011 | Camacho et al. |
| 2012/0161331 | A1 | 6/2012 | Gonzalez et al. |
| 2012/0248626 | A1* | 10/2012 | Lee .................. H01L 21/76898 257/774 |

* cited by examiner

SEMICONDUCTOR DEVICE AND METHOD OF FORMING EWLB SEMICONDUCTOR PACKAGE WITH VERTICAL INTERCONNECT STRUCTURE AND CAVITY REGION

CLAIM TO DOMESTIC PRIORITY

The present application is a division of U.S. patent application Ser. No. 13/149,628, now U.S. Pat. No. 9,252,172, filed May 31, 2011, which application is incorporated herein by reference.

FIELD OF THE INVENTION

The present invention relates in general to semiconductor devices and, more particularly, to a semiconductor device and method of forming an eWLB semiconductor package with a vertical interconnect structure and cavity region.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Some semiconductor die contain optical sensors in a central active region of the die. The optical sensors convert light energy to electrical signals. The electrical signals are routed through the semiconductor die to the die interconnect structure. The optical sensors impose additional space constraints on the interconnect structure as RDLs, which are typically used for interconnect rerouting, cannot pass through the glass or light-receiving side of the die. The requisite interconnect structure increases the package size. Hence, it is difficult to achieve optimal wafer-level integration and space efficient electrical interconnect for semiconductor die having an optical active region.

SUMMARY OF THE INVENTION

A need exists for a semiconductor die containing an active region and requisite interconnect structure while maintaining a small package size. Accordingly, in one embodiment, the present invention is a method of making a semiconductor device comprising the steps of providing a substrate including an optical grade material, disposing a plurality of spacers over a surface of the substrate, disposing a first semiconductor die over the spacers with an active region of the first semiconductor die oriented toward the substrate and positioned over an opening between the spacers, depositing an encapsulant around the first semiconductor die, and forming an interconnect structure over a surface of the first semiconductor die opposite the active region.

In another embodiment, the present invention is a method of making a semiconductor device comprising the steps of providing a substrate, disposing a spacer over a surface of the substrate, disposing a first semiconductor die over the spacer with an active region of the first semiconductor die positioned over an opening in the spacer, and forming an interconnect structure over a surface of the first semiconductor die opposite the active region.

In another embodiment, the present invention is a method of making a semiconductor device comprising the steps of providing a substrate including a region capable of passing an external stimuli, disposing a spacer over a surface of the substrate, disposing a first semiconductor die over the spacer to receive the external stimuli through an opening in the spacer, and forming an interconnect structure over the first semiconductor die.

In another embodiment, the present invention is a method of making a semiconductor device comprising the steps of providing a substrate, providing a semiconductor die, and disposing a spacer between the substrate and the semiconductor die with an active region of the semiconductor die positioned over an opening in the spacer.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
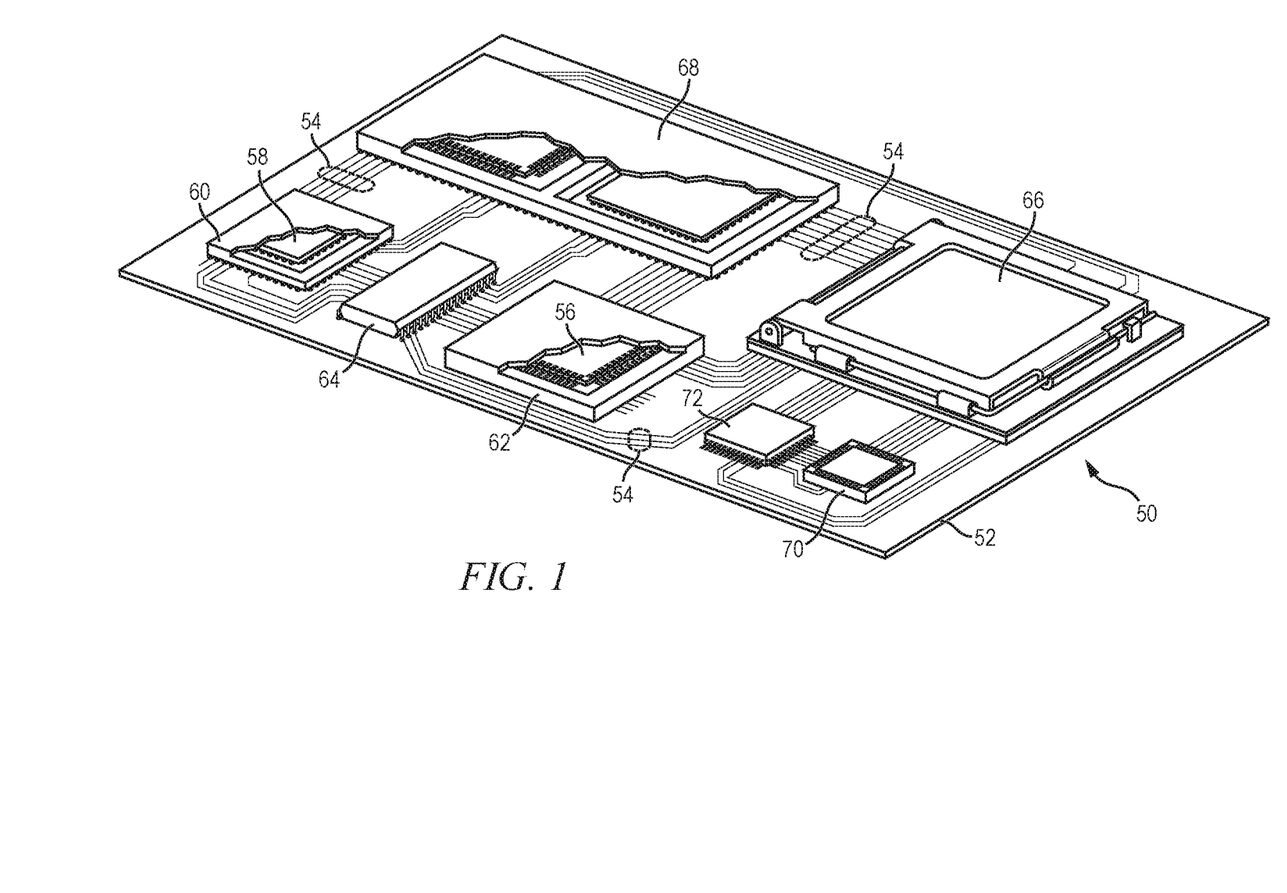
FIG. 1 illustrates a PCB with different types of packages mounted to its surface.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
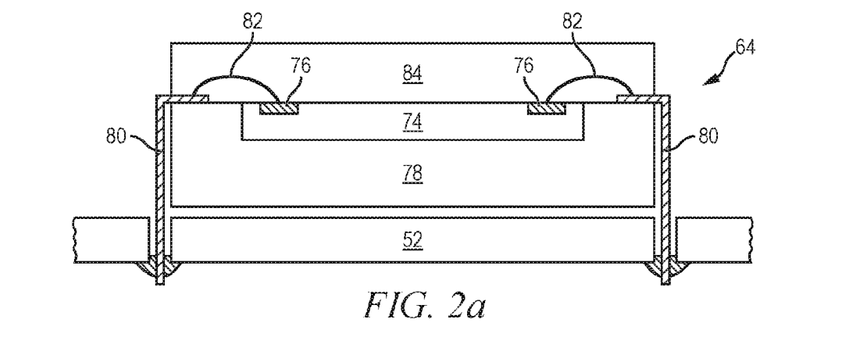
FIGS. 2a-2c illustrate further detail of the representative semiconductor packages mounted to the PCB.

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

Figure 2B:
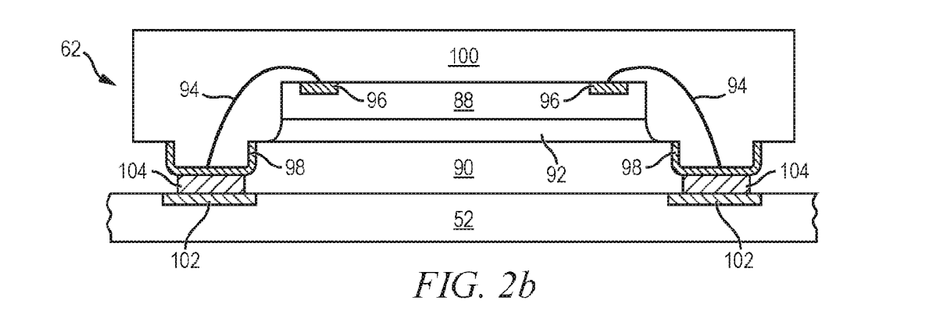

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

Figure 2C:
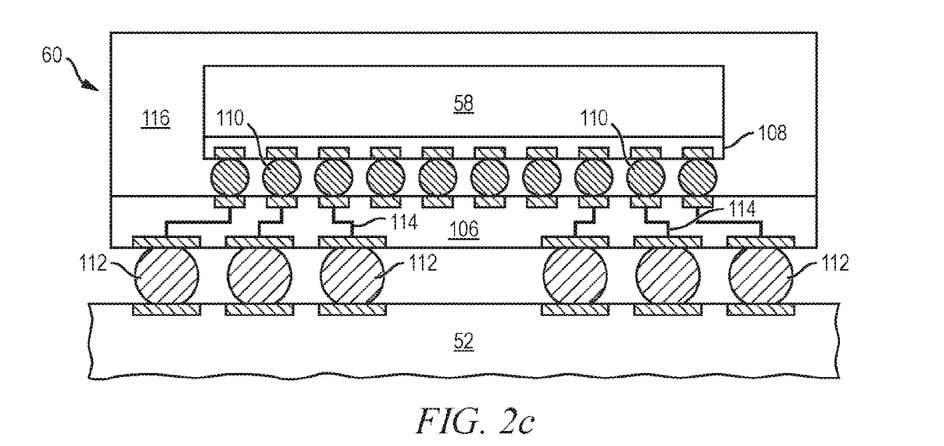

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
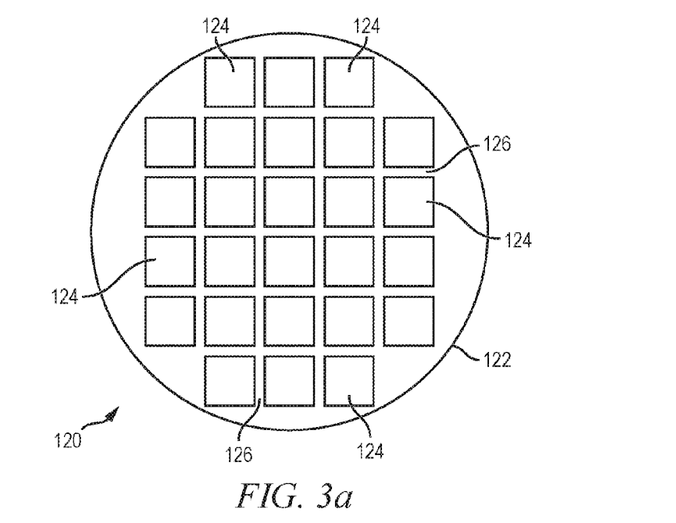
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
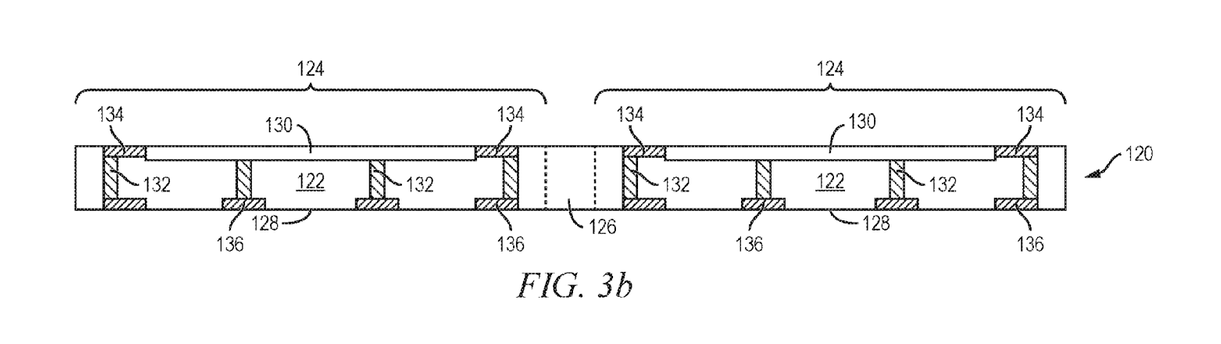

FIG. 3b shows a cross-sectional view of a portion of semiconductor wafer 120. Each semiconductor die 124 has a back surface 128 and active surface region 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active region 130 to implement analog circuits or digital circuits, such as digital signal processor (DSP), ASIC, memory, or other signal processing circuit. In particular, active region 130 can contain optically sensitive or photo-reactive semiconductor devices, such as an optical sensor or optically activated transistors and diodes. In one embodiment, active region 130 of semiconductor die 124 contains a CMOS image sensor (CIS) responsive to light. In another embodiment, active region 130 contains a micro-electro mechanical system (MEMS), such as a motion sensor or gravity sensor, responsive to various external stimuli. Semiconductor die 124 may also contain integrated passive devices (IPDs), such as inductors, capacitors, and resistors, for RF signal processing.

A plurality of vias is formed through semiconductor wafer 120 using mechanical drilling, laser drilling, or deep reactive ion etching (DRIE). The vias are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 132 embedded within semiconductor die 124. Conductive TSV 132 can be under active region 130 and outside the active region.

An electrically conductive layer 134 is formed a surface of semiconductor die 124 between conductive TSV 132 and active region 130 using PVD, CVD, electrolytic plating, electroless plating process, or other suitable metal deposition process. An electrically conductive layer 136 is formed over back surface 128 of semiconductor die 124 using PVD, CVD, electrolytic plating, electroless plating process, or other suitable metal deposition process. Conductive layers 134 and 136 can be one or more layers of Al, Cu, Sn, Ni, Au, Ag, or other suitable electrically conductive material. Conductive layer 134 operates as redistribution layers (RDL) electrically connected between conductive TSVs 132 and the optical circuits in active region 130. Conductive layer 136 operates as contact pads for conductive TSVs 132 as well as an RDL on back surface 128. Contact pads 136 can be disposed side-by-side a first distance from the edge of semiconductor die 124. Alternatively, contact pads 136 can be offset in multiple rows such that a first row of contact pads is disposed a first distance from the edge of the die, and a second row of contact pads alternating with the first row is disposed a second distance from the edge of the die.

Figure 3C:
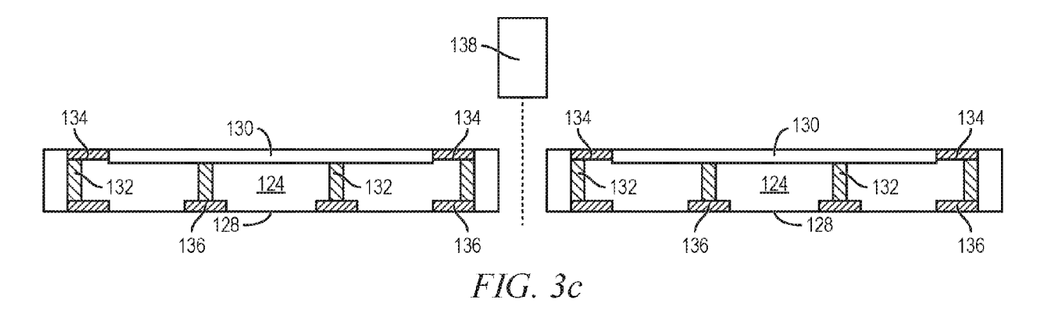

In FIG. 3c, semiconductor wafer 120 is singulated through saw street 126 using a saw blade or laser cutting tool 138 into individual TSV semiconductor die 124.

Figure 4A:
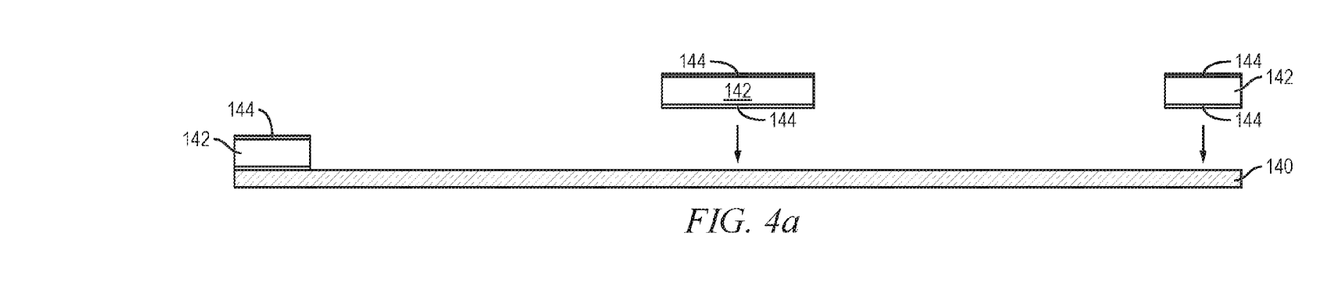
FIGS. 4a-4i illustrate a process of forming an eWLB package with a vertical interconnect structure and translucent substrate over an active region of the die.
Figure 4B:
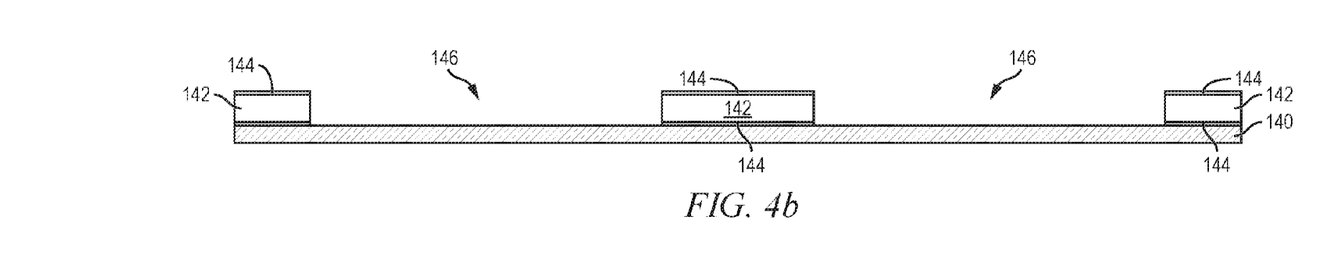

FIGS. 4a-4i illustrate, in relation to FIGS. 1 and 2a-2c, a process of forming an eWLB semiconductor package with a vertical interconnect structure and transparent or translucent substrate over an active region of the semiconductor die. FIG. 4a shows a base substrate 140 made with glass, silicon oxide film, silicon nitride film, alumina ceramics, single crystalline, polycrystalline, or other suitable optically transparent or translucent material capable of passing light. A plurality of spacers 142 is mounted to translucent substrate 140 with an adhesive 144. Spacers 142 can be a polymer material or silicon material with coefficient of thermal expansion (CTE) matched to semiconductor die 124. Adhesive 144 can be applied to opposing surfaces of spacers 142. In one embodiment, spacers 142 are individual bodies placed over translucent substrate 140 to create openings 146. Alternatively, spacers 142 are embodied in a continuous frame with openings 146. FIG. 4b shows spacers 142 mounted to translucent substrate 140 with openings 146.

Figure 4C:
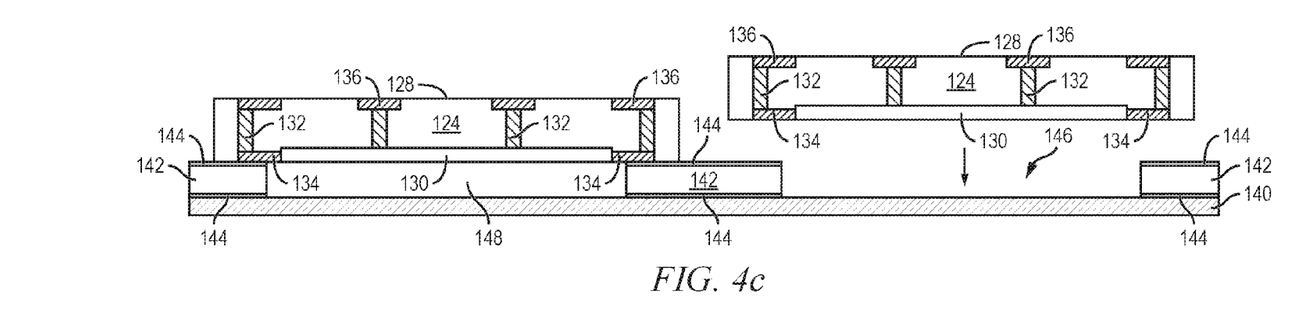
Figure 4D:
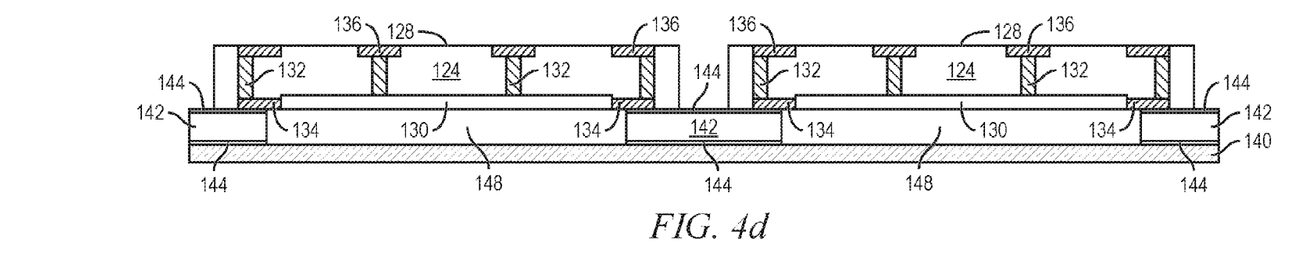

In FIG. 4c, TSV semiconductor die 124 from FIGS. 3a-3c are mounted to spacers 142 using a pick and place operation with active region 130 oriented toward translucent substrate 140 and positioned over openings 146. Semiconductor die 124 is tightly bonded or penetrates into spacer 142 to form a seal around gap 148. FIG. 4d shows TSV semiconductor die 124 mounted to spacers 142 with active region 130 separated from translucent substrate 140 by spacers 142 with gap 148 between the active region and translucent substrate.

Figure 4E:
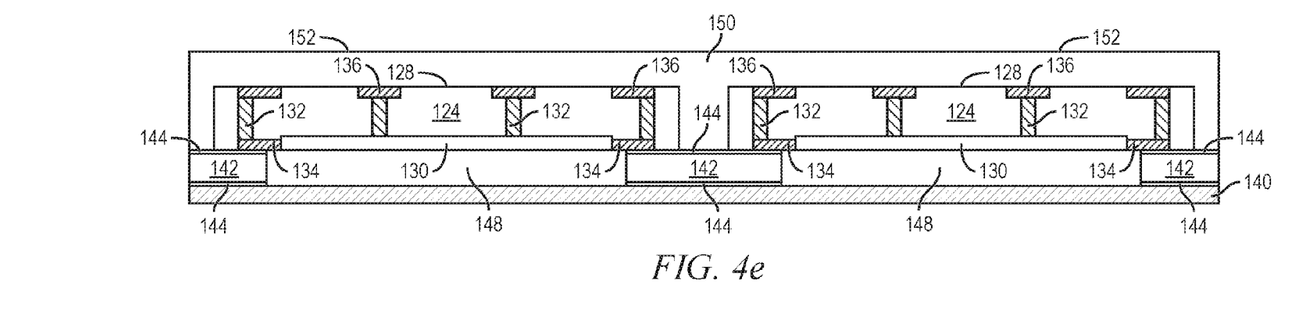

In FIG. 4e, an encapsulant or molding compound 150 is deposited over and around semiconductor die 124 and spacers 142 using a paste printing, compressive molding, transfer molding, liquid encapsulant molding, vacuum lamination, spin coating, or other suitable applicator. Encapsulant 150 can be polymer composite material, such as epoxy resin with filler, epoxy acrylate with filler, or polymer with proper filler. The seal between semiconductor die 124 and spacer 142 prevents bleeding of encapsulant 150 into gap 148 and contacting active region 130 or translucent substrate 140. Accordingly, there is no encapsulant 150 within gap 148 contacting active region 130 or translucent substrate 140 after encapsulation. Encapsulant 150 is non-conductive and environmentally protects the semiconductor device from external elements and contaminants.

Figure 4F:
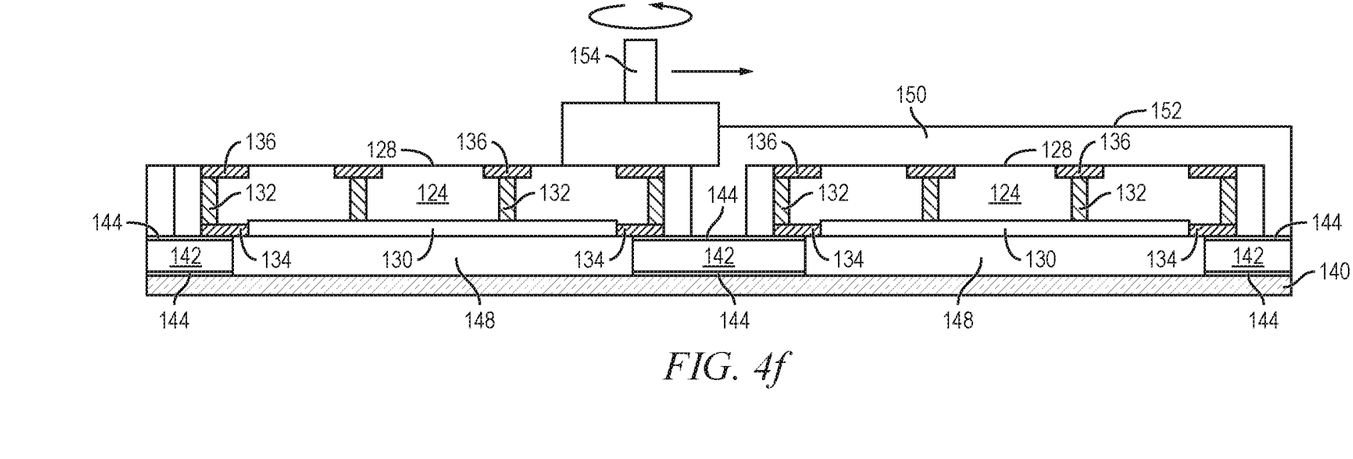
Figure 4G:
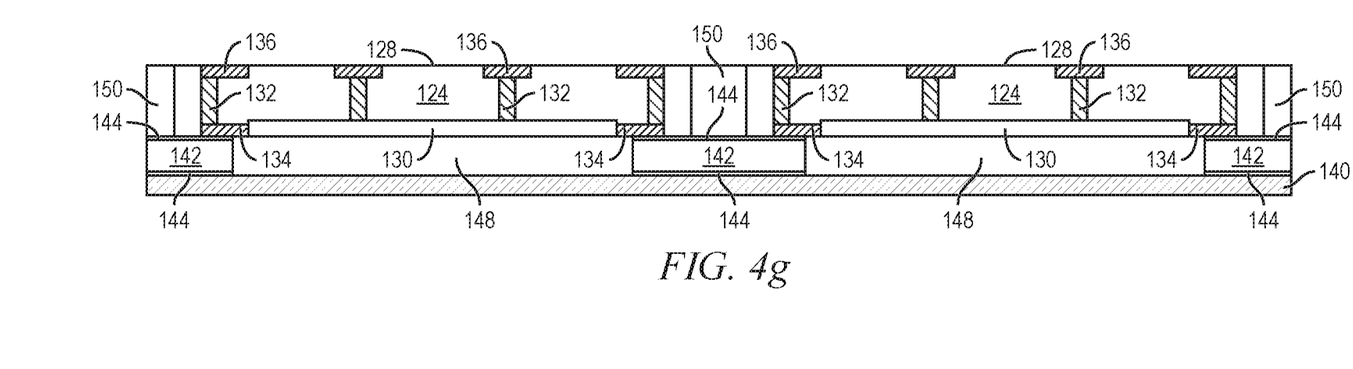

In FIG. 4f, back surface 152 of encapsulant 150 undergoes a backgrinding operation using grinder 154 to remove the encapsulant to back surface 128 of semiconductor die 124 and expose conductive layer 136 or conductive TSV 132. The exposed conductive layer 136 or conductive TSVs 132 can be electrically connected to external semiconductor die or packages with micro-bumps. An optional CMP process can be used after backgrinding to ensure co-planarity of encapsulant 150 and back surface 128 prior to forming a build-up interconnect structure, as shown in FIG. 4g.

Figures 4H, 4I:
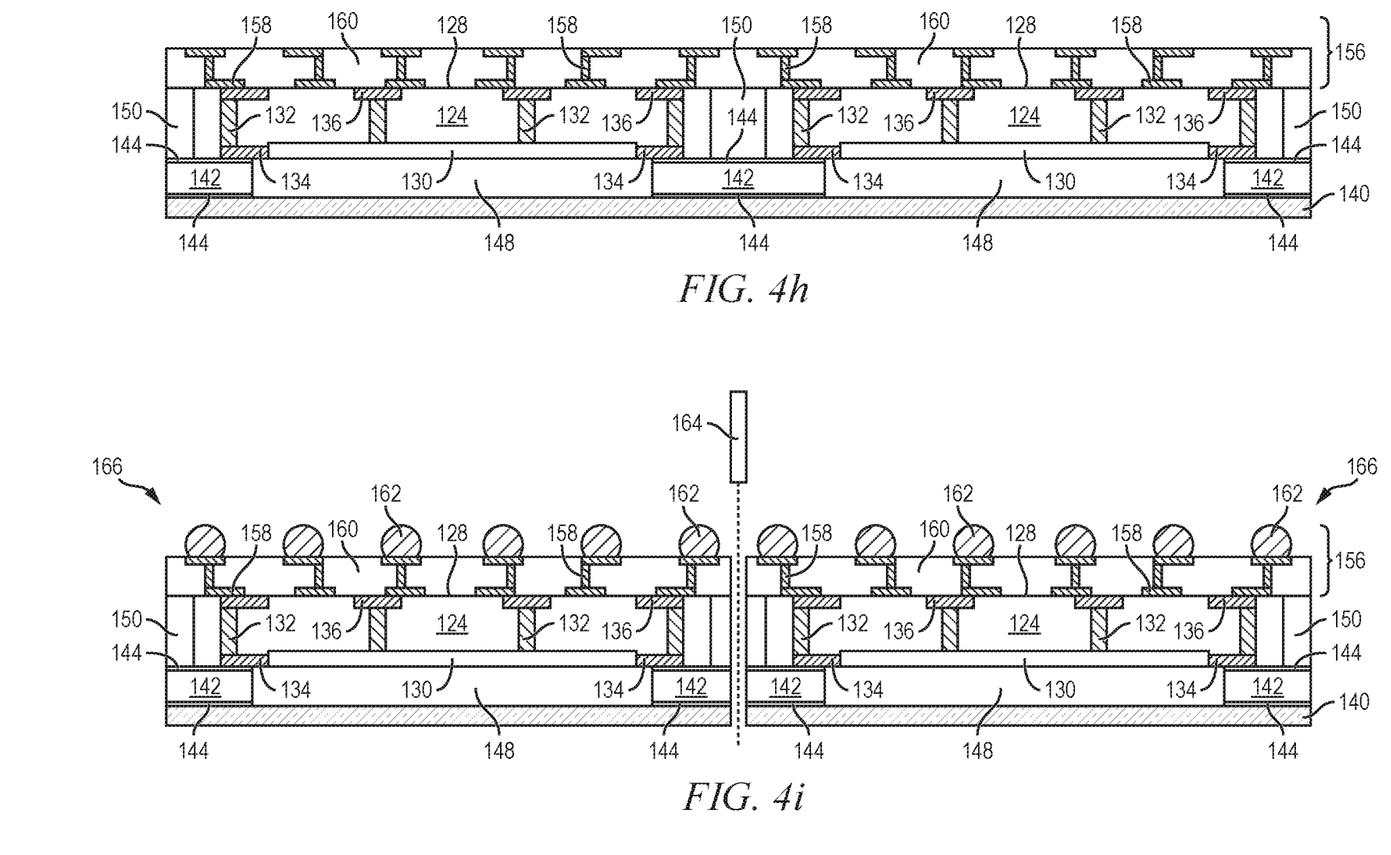

In FIG. 4h, a build-up interconnect structure 156 is formed over encapsulant 150 and back surface 128 of semiconductor die 124. The build-up interconnect structure 156 includes multiple electrically conductive layers or RDLs 158 formed over semiconductor die 124 and encapsulant 150 using a patterning and metal deposition process such as sputtering, electrolytic plating, and electroless plating. Conductive layers 158 can be one or more layers of Al, Cu, Sn, Ni, Au, Ag, or other suitable electrically conductive material. Conductive TSV 132 can be under active region 130 and outside the active region. One portion of conductive layers 158 is electrically connected to conductive layer 136 and conductive TSVs 132 of semiconductor die 124. Other portions of conductive layers 158 can be electrically common or electrically isolated depending on the design and function of semiconductor die 124.

An insulating or passivation layer 160 is formed between conductive layers 158 for electrical isolation using PVD, CVD, printing, spin coating, spray coating, sintering or thermal oxidation. The insulating layer 160 contains one or more layers of solder resist, silicon dioxide (SiO2), silicon nitride (Si3N4), silicon oxynitride (SiON), tantalum pentoxide (Ta2O5), aluminum oxide (Al2O3), or other material having similar insulating and structural properties. Conductive layer 158 includes z-direction conductive vias formed through insulating layer 160. The conductive vias can have straight or tapered sidewalls. A portion of insulating layer 160 can be removed by an etching process to expose conductive layer 158.

In FIG. 4i, an electrically conductive bump material is deposited over build-up interconnect structure 156 and electrically connected to the exposed portion of conductive layers 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 158 using a suitable attachment or bonding process. In one embodiment, the bump material is reflowed by heating the material above its melting point to form spherical balls or bumps 162. In some applications, bumps 162 are reflowed a second time to improve electrical contact to conductive layer 158. Bumps 162 can also be compression bonded to conductive layer 158. Bumps 162 represent one type of interconnect structure that can be formed over conductive layer 158. The interconnect structure can also use stud bump, micro bump, or other electrical interconnect.

Figure 5:
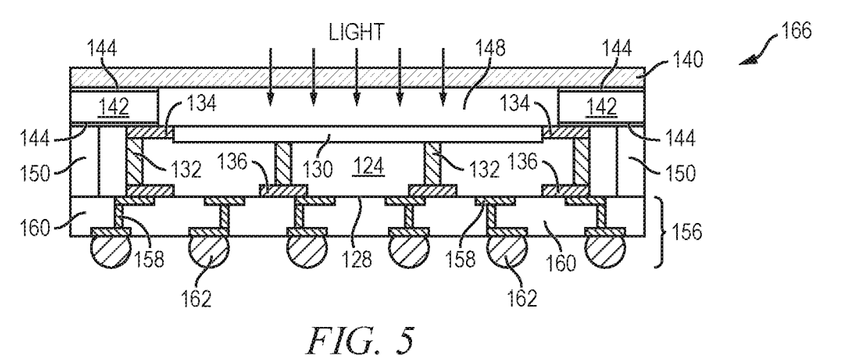
FIG. 5 illustrates the eWLB semiconductor package with the vertical interconnect structure and translucent substrate over the active region.

Semiconductor die 124 are singulated through encapsulant 150, build-up interconnect structure 156, and spacers 142 with saw blade or laser cutting tool 164 into individual embedded wafer-level ball grid array (eWLB) semiconductor packages 166. FIG. 5 shows eWLB semiconductor package 166 after singulation. The TSV semiconductor die 124 is embedded within encapsulant 150 and electrically connected through build-up interconnect structure 156 for external interconnect from a bottom side of eWLB semiconductor package 166, opposite active region 130. The active region 130 receives light through translucent substrate 140. The vertical interconnect structure provided by conductive TSV 132 and conductive layers 158 provides an efficient electrical interconnect while reducing the size of eWLB semiconductor package 166.

Figure 6:
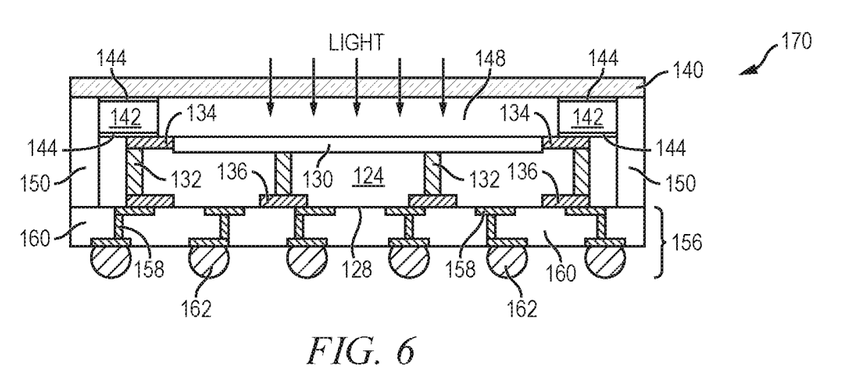
FIG. 6 illustrates the eWLB semiconductor package with the encapsulant extending to the translucent substrate.

FIG. 6 shows an embodiment of eWLB semiconductor package 170, similar to FIG. 5, with encapsulant 150 formed around spacer 142. In this case, spacers 142 are located within a footprint of semiconductor die 124 so the deposition of encapsulant 150 extends along the spacers to translucent substrate 140, similar to FIG. 4f.

Figure 7:
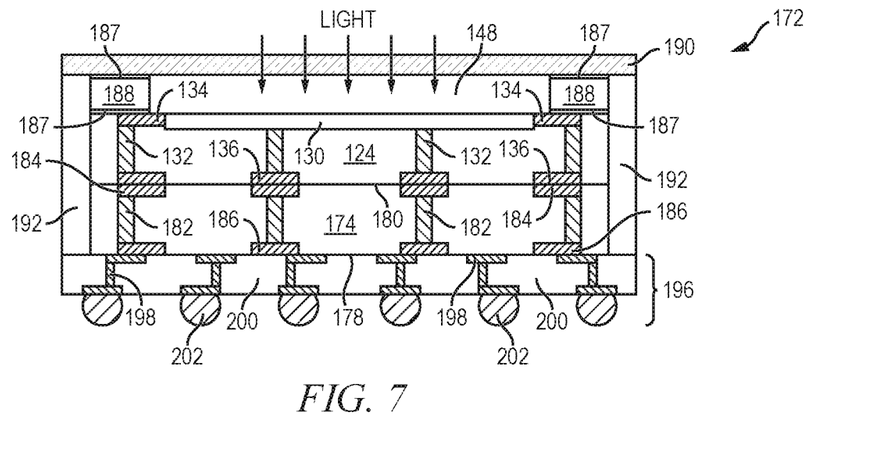
FIG. 7 illustrates the eWLB semiconductor package with stacked semiconductor die.

FIG. 7 shows an embodiment of eWLB semiconductor package 172, similar to FIG. 6, with stacked semiconductor die. Semiconductor die 174 has a back surface 178 and active surface 180 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active region 180 to implement analog circuits or digital circuits, such as DSP, ASIC, memory, or other signal processing circuit. Semiconductor die 174 may also contain IPDs, such as inductors, capacitors, and resistors, for RF signal processing. In one embodiment, semiconductor die 174 is a memory device.

A plurality of vias is formed through semiconductor die 174 using mechanical drilling, laser drilling, or DRIE. The vias are filled with Al, Cu, Sn, Ni, Au, Ag, Ti, W, polysilicon, or other suitable electrically conductive material using electrolytic plating, electroless plating process, or other suitable metal deposition process to form z-direction conductive TSV 182 embedded within semiconductor die 174.

An electrically conductive layer 184 is formed over a surface of semiconductor die 174 between conductive TSV 182 and active surface 180 using PVD, CVD, electrolytic plating, electroless plating process, or other suitable metal deposition process. An electrically conductive layer 186 is formed over back surface 178 using PVD, CVD, electrolytic plating, electroless plating process, or other suitable metal deposition process. Conductive layers 184 and 186 can be one or more layers of Al, Cu, Sn, Ni, Au, Ag, or other suitable electrically conductive material. Conductive layer 184 operates as an RDL electrically connected between conductive TSVs 182 and the circuits in active surface 180. Conductive layer 186 operates as contact pads for conductive TSVs 182 as well as an RDL on back surface 178.

Semiconductor die 124 is mounted to semiconductor die 174 and the stack die are mounted to spacers 188 with active region 130 of semiconductor die 124 oriented toward translucent substrate 190, similar to FIG. 4c. Semiconductor die 124 and 174 are electrically connected through conductive TSVs 132 and 182, as well as conductive layers 134, 136, 184, and 186.

An encapsulant or molding compound 192 is deposited over and around semiconductor die 124 and 174 and spacers 188 using a paste printing, compressive molding, transfer molding, liquid encapsulant molding, vacuum lamination, spin coating, or other suitable applicator. Encapsulant 192 can be polymer composite material, such as epoxy resin with filler, epoxy acrylate with filler, or polymer with proper filler. Encapsulant 192 is non-conductive and environmentally protects the semiconductor device from external elements and contaminants. Spacers 188 are located within a footprint of semiconductor die 124 so the deposition of encapsulant 192 extends along the spacers to translucent substrate 190.

The back surface of encapsulant 192 undergoes a backgrinding operation using a grinder to planarize the encapsulant to back surface 178 of semiconductor die 174 and expose conductive layer 186, similar to FIG. 4f. An optional CMP process can be used after backgrinding to ensure co-planarity of encapsulant 192 and back surface 178 prior to forming a build-up interconnect structure.

A build-up interconnect structure 196 is formed over encapsulant 192 and back surface 178 of semiconductor die 174, similar to FIGS. 4h-4i. The build-up interconnect structure 196 includes multiple electrically conductive layers or RDLs 198 and insulating layer 200 around the conductive layers. A plurality of bumps 202 is formed over the exposed conductive layer 198.

The TSV semiconductor die 124 and 174 are embedded within encapsulant 192 and electrically connected through build-up interconnect structure 196 for external interconnect from a bottom side of eWLB semiconductor package 172, opposite active region 130. The active region 130 receives light through translucent substrate 190. The vertical interconnect structure provided by conductive TSVs 132 and 182 and build-up interconnect structure 196 provides efficient electrical interconnect while reducing the size of eWLB semiconductor package 172.

Figure 8:
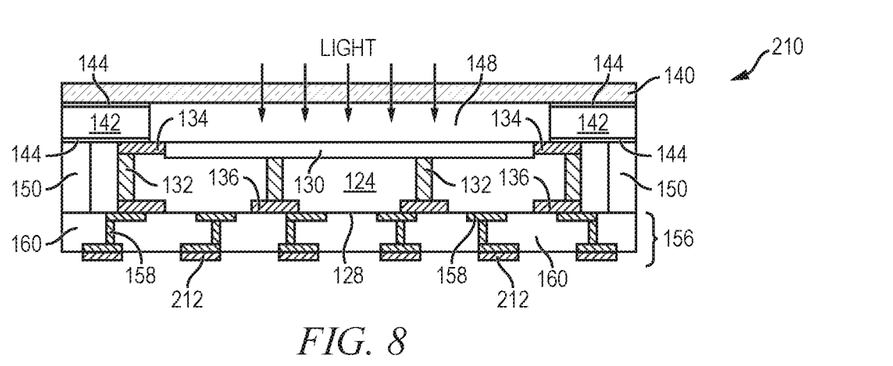
FIG. 8 illustrates the eWLB semiconductor package with an interconnect structure having multiple solder wettable layers.

FIG. 8 shows an embodiment of eWLB semiconductor package 210, continuing from FIG. 4h, with multiple solder wettable layers 212, such as Ni/Pt/Au, formed over conductive layer 158.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including an optical grade material;

disposing a plurality of spacers over a surface of the substrate;

disposing a first semiconductor die over the spacers with an optically active region of the first semiconductor die oriented toward the substrate and positioned over an opening between the spacers;

depositing an encapsulant around the first semiconductor die; and forming an interconnect structure over a surface of the first semiconductor die opposite the optically active region.

2. The method of claim 1, further including forming a plurality of conductive vias through the first semiconductor die.

3. The method of claim 1, further including forming a seal between the first semiconductor die and spacers to block the encapsulant from contacting the optically active region or substrate.

4. The method of claim 1, wherein the optically active region includes a sensor or micro-electro mechanical system.

5. The method of claim 1, further including disposing a second semiconductor die over the first semiconductor die.

6. The method of claim 1, further including removing a portion of the encapsulant to be coplanar with the surface of the first semiconductor die.

7. A method of making a semiconductor device, comprising:

providing a substrate;

disposing a spacer over a surface of the substrate;

disposing a first semiconductor die over the spacer with an active region of the first semiconductor die oriented toward and positioned over an opening in the spacer; and forming an interconnect structure over a surface of the first semiconductor die opposite the active region.

8. The method of claim 7, further including forming a plurality of conductive vias through the first semiconductor die.

9. The method of claim 7, further including forming a seal between the first semiconductor die and spacer to block the encapsulant from contacting the active region or substrate.

10. The method of claim 7, wherein the active region includes a sensor or micro-electro mechanical system.

11. The method of claim 7, further including depositing an encapsulant over the first semiconductor die.

12. The method of claim 11, further including removing a portion of the encapsulant to be coplanar with the surface of the first semiconductor die.

13. The method of claim 7, further including disposing a second semiconductor die over the first semiconductor die.

14. A method of making a semiconductor device, comprising:

providing a substrate including a region capable of passing an external stimuli;

disposing a spacer over a surface of the substrate;

disposing a first semiconductor die over the spacer, wherein the first semiconductor die includes an optically active region receiving the external stimuli through an opening in the spacer; and forming an interconnect structure over a surface of the first semiconductor die opposite the optically active region of the first semiconductor die.

15. The method of claim 14, further including forming a plurality of conductive vias through the first semiconductor die.

16. The method of claim 14, further including forming a seal between the first semiconductor die and spacer.

17. The method of claim 14, wherein the optically active region of the first semiconductor die includes a sensor or micro-electro mechanical system.

18. The method of claim 14, further including depositing an encapsulant around the first semiconductor die.

19. The method of claim 14, further including disposing a second semiconductor die over the first semiconductor die.

20. The method of claim 14, wherein the external stimuli includes light.

* * * * *